US008793557B2

(12) United States Patent
Smyth

(10) Patent No.: US 8,793,557 B2
(45) Date of Patent: Jul. 29, 2014

(54) METHOD AND APPARATUS FOR REAL-TIME MULTIDIMENSIONAL ADAPTATION OF AN AUDIO CODING SYSTEM

(75) Inventor: Neil Smyth, Bangor (GB)

(73) Assignee: Cambrige Silicon Radio Limited, Cambridge (GB)

( * ) Notice: Subject to any disclaimer, the term of this patent is extended or adjusted under 35 U.S.C. 154(b) by 159 days.

(21) Appl. No.: 13/465,331

(22) Filed: May 7, 2012

(65) Prior Publication Data

US 2012/0296658 A1 Nov. 22, 2012

Related U.S. Application Data

(63) Continuation-in-part of application No. 13/111,420, filed on May 19, 2011.

(30) Foreign Application Priority Data

Jun. 30, 2011 (GB) .................................. 1111161.4

(51) Int. Cl.
*H03M 13/00* (2006.01)

(52) U.S. Cl.
USPC .......................................... 714/774; 704/500

(58) Field of Classification Search
None
See application file for complete search history.

(56) References Cited

U.S. PATENT DOCUMENTS

| | | | | |
|---|---|---|---|---|
| 5,073,940 | A | 12/1991 | Zinser et al. | |
| 5,247,579 | A * | 9/1993 | Hardwick et al. | 704/230 |
| 5,819,215 | A * | 10/1998 | Dobson et al. | 704/230 |
| 6,405,338 | B1 * | 6/2002 | Sinha et al. | 714/752 |
| 7,613,606 | B2 * | 11/2009 | Makinen | 704/221 |
| 2005/0055203 | A1 * | 3/2005 | Makinen et al. | 704/229 |
| 2008/0043643 | A1 * | 2/2008 | Thielman et al. | 370/260 |
| 2009/0006104 | A1 * | 1/2009 | Sung et al. | 704/500 |
| 2010/0324915 | A1 | 12/2010 | Seo et al. | |

FOREIGN PATENT DOCUMENTS

EP 0971338 1/2000

OTHER PUBLICATIONS

Great Britain Search Report for Appln. No. GB1111161.4, dated Aug. 21, 2012.

* cited by examiner

*Primary Examiner* — John Trimmings
(74) *Attorney, Agent, or Firm* — RatnerPrestia

(57) ABSTRACT

An adaptive controller for a configurable audio coding system including a fuzzy logic controller modified to use reinforcement learning to create an intelligent control system. With no knowledge of the external system into which it is placed the audio coding system, under the control of the adaptive controller, is capable of adapting its coding configuration to achieve user set performance goals.

37 Claims, 7 Drawing Sheets

METHOD AND APPARATUS FOR REAL-TIME MULTIDIMENSIONAL ADAPTATION OF AN AUDIO CODING SYSTEM

CROSS REFERENCE TO RELATED APPLICATIONS

This application is a Continuation-In-Part of U.S. application Ser. No. 13/111,420, filed May 19, 2011 the contents of which are incorporated herein.

FIELD OF THE INVENTION

The present invention relates to audio coding systems. The invention relates particularly to the control of a multi-dimensional audio coding apparatus and method.

BACKGROUND TO THE INVENTION

Some audio coding apparatus may be configured to achieve different levels of performance across one or more performance measures, e.g. relating to complexity, battery life, latency, bit rate, error resilience and quality. This may be achieved by selecting from a range of audio coding tools each having a respective effect on performance in respect of one or more performance measures. Such apparatus may be referred to as multi-dimensional audio coding apparatus, and the corresponding algorithms may be referred to as multi-dimensional audio coding algorithms.

During use, the configuration of the coding apparatus may have to be modified over time to achieve varying performance goals. This configuration can be complex given the high number of possible coding tool combinations and their varying impact on the coding apparatus. The coding apparatus may also behave differently depending upon the system and hardware platform in which it is incorporated during use and/or the task it is performing at any given moment. This results in a coding algorithm that is difficult to characterize and control.

It would be desirable to provide an adaptive control mechanism to optimally select an appropriate set of audio coding tools at any given instant using system performance measures.

SUMMARY OF THE INVENTION

A first aspect of the invention provides a controller for a configurable audio coding system, said audio coding system comprising at least one selectable and/or configurable coding tool, the controller being arranged to receive from said audio coding system an input comprising at least one performance parameter value indicating at least one performance characteristic of the audio coding system, said controller being configured to evaluate a respective one or more of said at least one performance parameter values against a respective one or more performance goals to produce error data in respect of said at least one performance characteristic, said controller comprising a respective coding tool agent for at least some of said selectable and/or configurable coding tools, said respective coding tool being arranged to select one or more of, and/or select a configuration of, one or more of said at least one selectable and/or configurable coding tools depending on respective error data.

Preferably, at least one error management agent is configured to evaluate a respective one or more of said at least one performance parameter values against a respective one or more performance goals to produce said error data in respect of said at least one performance characteristic, and wherein at least some of said error data is provided to the or each coding tool agent. Said at least one error management agent preferably comprises a respective error management agent for said at least one performance characteristic.

In preferred embodiments, said at least one error management agent is arranged to, during said evaluation, dampen fluctuations in said error data caused by relatively short term deviations of said at least one performance parameter values against one or more respective performance goals.

Preferably, at least one of said at least one selectable and/or configurable coding tool comprises an error resilience coding tool, said controller further including at least one error resilience agent arranged to select one or more of and/or select and configuration of said at least one error resilience coding tools depending on at least some of said error data. Advantageously, said at least one coding tool agent is arranged to provide to said at least one error resilience agent data indicating the or each selection made by said at least one coding tool agent.

Said at least one error resilience agent may selectively override one or more of said selections made by said at least one coding tool agent depending on an evaluation made by said at least one error resilience agent of at least some of said error data.

In preferred embodiments, said at least one error resilience agent is arranged to evaluate data, preferably including error data, relating to one or more of bit error rate, packet loss rate, an average bit error rate of said audio coding system and/or any other statistic relating to the performance of the transmission channel of said audio coding system, wherein said average bit error rate comprises a measure of the average number of consecutive bit errors. Said at least one error resilience agent may be arranged to selectively enable or disable entropy encoding based on an evaluation of at least some of said error data. Advantageously, said at least one error resilience agent is arranged to selectively enable or disable entropy encoding depending on the bit error rate of said audio coding system.

Typically, said at least one error resilience agent is arranged to select one or more of and/or select and configuration of said at least one error resilience coding tools depending on the algorithmic latency and/or complexity of said audio coding system.

In typical embodiments, said at least one coding tool agents comprises a plurality of coding tool agents, said controller being arranged to activate one or more of said coding tool agents in a respective one or more of a sequence of episodes. At least one of said coding tool agents may be activated during only one of said episodes, for example coding tool agents relating to any one or more of: prediction of sub-band samples; sub-band filter selection or configuration; sub-band analysis; sub-band selection and configuration; and/or quantization. At least one of said coding tool agents may be activated during all of said episodes, for example coding tool agents relating to any one or more of: bit allocation; inter-channel decorrelation; intra-channel decorrelation; and/or lossless entropy encoding.

Advantageously, said controller is arranged to terminate any one of said episodes an begin the next of said episodes upon determining that at least one of the coding tools activatable during said any one episode has completed its selection process. Typically, said controller is arranged to run said sequence of episodes in a continuous cycle.

In preferred embodiments, said at least one coding tool agent and/or said at least one resilience tool agent comprises a respective machine learning agent.

A second aspect of the invention provides a controller for a configurable audio coding system, the controller being arranged to receive from said audio coding system an input comprising at least one performance parameter value indicating at least one performance characteristic of the audio coding system, wherein said controller is configured to maintain a plurality of states, each state corresponding to at least one of said respective performance parameter values and being associated with at least one action for configuring said audio coding system, and wherein said controller comprises a reward calculator configured to calculate a reward parameter based on said at least one parameter value and at least one corresponding performance goal, a state-action evaluator configured to maintain a respective state-action evaluation value for said at least one action associated with each of said states, and to adjust said respective state-action evaluation value depending on a respective value of said reward parameter, an action selector configured to select, for a respective state, at least one of said at least one actions associated with said respective state based on an evaluation of the respective state-action evaluation values of said at least one actions associated with the respective state, and wherein said controller is configured to produce an output comprising data identifying said selected at least one action.

The controller typically includes a state quantizer configured to determine, from said at least one performance parameter value, a next one of said states to be taken by said controller.

Typically, said at least one performance parameter can take a range of values, said controller further including a state quantizer arranged to define a plurality of bands for said values, each band corresponding to a respective one of said states, and wherein said state quantizer is further arranged to determine to which of said bands said at least one performance parameter of said input belongs to.

The state quantizer may be configured to determine that the respective state corresponding to said determined band is a next state to be taken by said controller.

Preferably, said state-action evaluator is configured to adjust the respective state-action evaluation values for a respective state depending on a value of said reward parameter calculated using the at least one performance parameter value received in response to configuration of said audio coding system by said selected at least one action for said respective state.

Said state-action evaluator may be configured adjust the respective state-action evaluation values for a respective state depending on the corresponding state-action evaluation values for a next state to be taken by said controller.

In preferred embodiments, said controller is configured to implement a machine-learning algorithm for maintaining said state-action evaluation values, especially a reinforcement machine-learning algorithm, for example a SARSA algorithm.

Said at least one performance characteristic may include any one or more of computational complexity, computational latency, bit rate error, bit burst error rate or audio quality.

Said at least one action typically includes selection of at least one coding method or type of coding method for use by said audio coding system, and/or selection of a configuration of at least one coding method for use by said audio coding system.

In preferred embodiments said action selector comprises a fuzzy logic controller. The fuzzy logic controller preferably uses said respective state-action evaluation values of said at least one actions associated with the respective state to construct consequent fuzzy membership functions.

Said at least one of said respective performance parameter values and said least one action may be associated with a respective configurable aspect of the audio coding system. Said configurable aspect typically comprises a configurable coding tool or coding method.

A third aspect of the invention provides a method of controlling a configurable audio coding system, the method comprising: receiving from said audio coding system an input comprising at least one performance parameter value indicating at least one performance characteristic of the audio coding system; maintaining a plurality of states, each state corresponding to at least one of said respective performance parameter values and being associated with at least one action for configuring said audio coding system; calculating a reward parameter based on said at least one parameter value and at least one corresponding performance goal; maintaining a respective state-action evaluation value for said at least one action associated with each of said states; adjusting said respective state-action evaluation value depending on a respective value of said reward parameter; selecting, for a respective state, at least one of said at least one actions associated with said respective state based on an evaluation of the respective state-action evaluation values of said at least one actions associated with the respective state; and producing an output comprising data identifying said selected at least one action.

A fourth aspect of the invention provides a configurable audio coding system comprising the controller of the first aspect of the invention.

A fifth aspect of the invention provides a method of controlling a configurable audio coding system, said audio coding system comprising at least one selectable and/or configurable coding tool, the method comprising: receiving from said audio coding system an input comprising at least one performance parameter value indicating at least one performance characteristic of the audio coding system; evaluating a respective one or more of said at least one performance parameter values against a respective one or more performance goals to produce error data in respect of said at least one performance characteristic; and selecting one or more of, and/or selecting a configuration of, one or more of said at least one selectable and/or configurable coding tools depending on respective error data.

From another aspect, the invention provides a configurable audio encoder comprising the adaptive controller of the first aspect of the invention.

A further aspect of the invention provides a computer program product comprising computer usable code for performing, when running on a computer, the method of the third or fifth aspects of the invention.

In preferred embodiments, the audio coding apparatus is arranged to adapt one or more of its audio coding functions and/or one or more characteristics of the audio coding algorithm that it implements, to achieve an optimal level of error control, and/or other performance measure(s), for a particular environment or application. In the case of error control, this may be achieved by providing the encoder with parameters describing the error characteristics of the transmission channel. In addition to transmission error characteristics, the preferred multidimensional audio coding apparatus is capable of cognitively adapting to achieve performance goals such as computational complexity (encoder complexity and/or decoder complexity), algorithmic latency and bit rate.

The cognitive ability of preferred multidimensional-adaptive audio coding apparatus embodying the invention provides the ability to adapt the operation of the apparatus to one or more performance measures, e.g. error measures such as detected bit and/or packet errors. Whilst other conventional audio coding algorithms could utilize error control tools, these schemes typically have coarse-grained control and predetermined error control characteristics that cannot be easily altered or shaped.

In preferred embodiments, the multidimensional-adaptive audio coding apparatus is configured to modify error control tools in a dynamic manner, e.g. according to external measures of channel noise and other system parameters. However, due to the multidimensional nature of the adaptation, such an apparatus should also be configured to know how the choice of error control strategy affects other performance goals, such as coded bit-rate, algorithmic latency, perceptual audio quality and computational complexity.

In preferred embodiments, therefore, an adaptive control mechanism is provided that, without requiring any prior knowledge of the system in which it is operating or the capabilities of the audio coding tools possessed by the multidimensional adaptive audio coding algorithm, is capable of learning which coding tools provide optimal performance. The adaptive control mechanism enables an audio coding algorithm to dynamically adapt to system demands such as reducing the audio coding complexity when a device enters a low power state or reducing bit rate to meet fluctuating transmission channel demands.

From another aspect, the invention provides a method of applying machine-learning to an audio coding algorithm such that the performance can be varied in terms of one or more of: the encoder complexity, decoder complexity, algorithmic latency, bit rate and error resilience (and/or other performance measures) whilst also pursuing the goal of achieving optimal audio quality for a given bit rate.

Further advantageous aspects of the invention will become apparent to those ordinarily skilled in the art upon review of the following description of a preferred embodiment and with reference to the accompanying drawings.

BRIEF DESCRIPTION OF THE DRAWINGS

An embodiment of the invention is now described by way of example and with reference to the accompanying drawings in which.

DETAILED DESCRIPTION OF THE DRAWINGS

Figure 1:
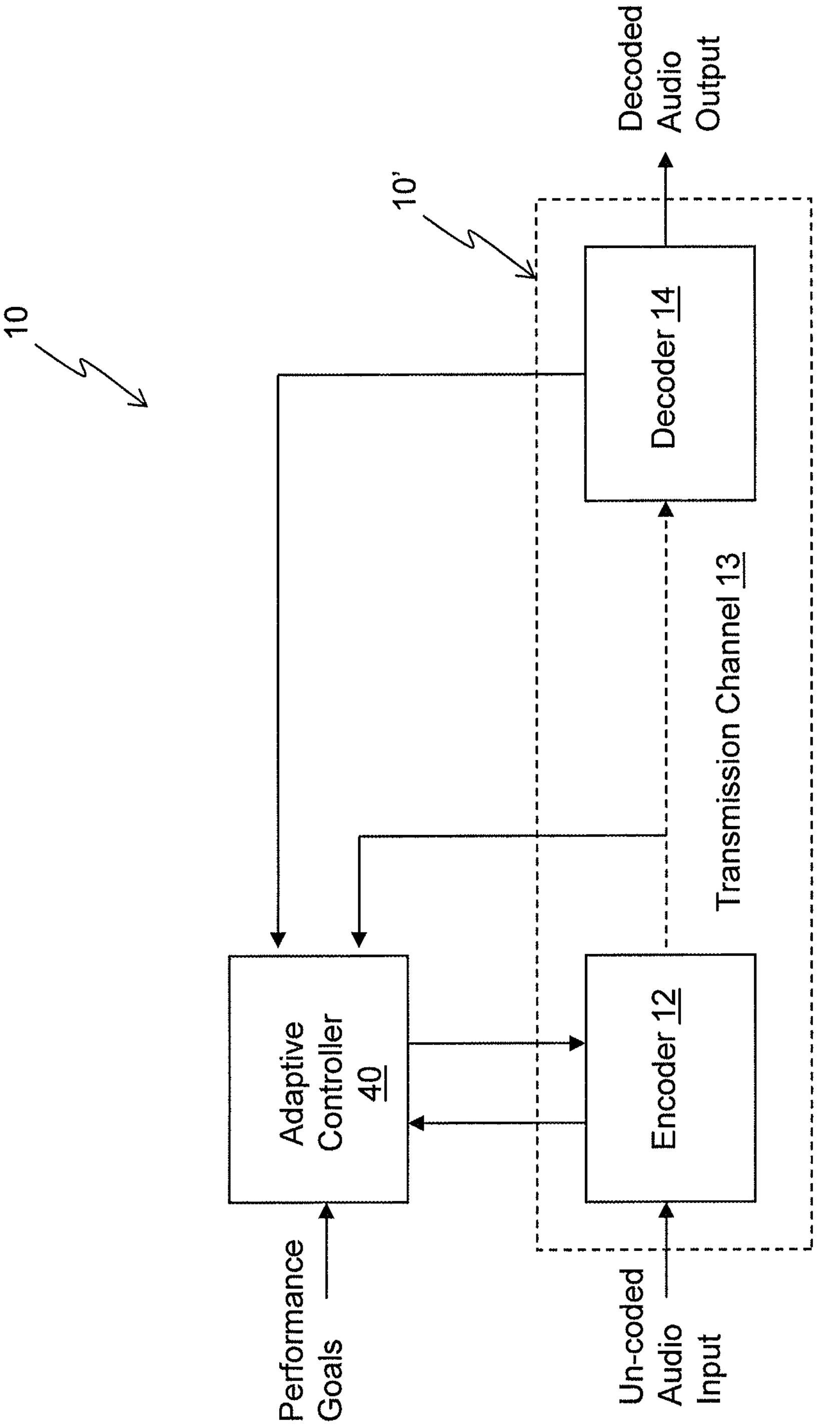
FIG. 1 is a schematic diagram illustrating an audio coding system comprising an audio encoder and an audio decoder.

FIG. 1 of the drawings shows a schematic diagram of an audio coding system 10, or audio transmission system, comprising an audio encoder 12 and an audio decoder 14 (which may collectively be referred to as a codec and which are identified in FIG. 1 as 10') capable of communicating with each other via a communications link 13, which may be wired or wireless. In use, the encoder 12 receives an input signal comprising a stream of audio data samples. The data samples typically comprise pulse code modulated (PCM) data samples, but may alternatively comprise any other suitable digital, or digitized, data samples. The encoder 12 applies one or more coding techniques, which typically result in compression of the input signal, to produce an output signal comprising a compressed data stream.

The compressed data stream provides the input signal for the decoder 14. The decoder 14 processes the incoming data stream to produce a decoded output signal comprising a stream of audio samples. The processing performed by the decoder 14 includes reversing any reversible coding or compression performed by the encoder 12.

Figure 2:
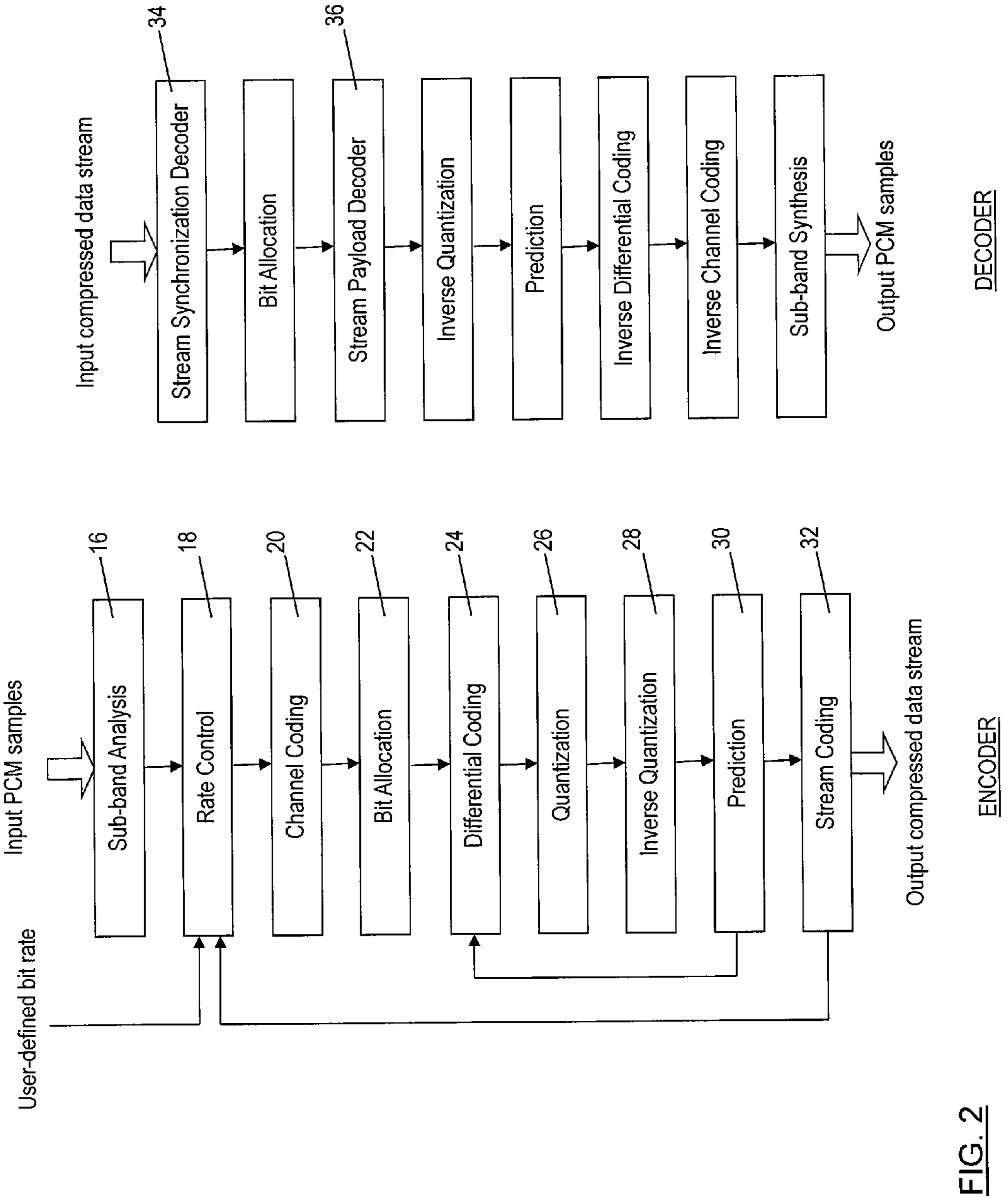
FIG. 2 is a schematic diagram illustrating a more detailed example of an encoder and a decoder.

In FIG. 2, more detailed examples of a suitable encoder 12 and decoder 14 are shown, comprising a plurality of functional blocks that represent respective stages in the audio encoding and decoding methods, or algorithms, performed respectively by the encoder 12 and decoder 14, and which may be implemented in hardware, by computer program(s), or by any combination of hardware and computer program(s), as is convenient.

By way of example, in the illustrated encoder 12, a sub-band analysis block 16 decomposes the input data samples into sub-bands (spectral, or frequency, decomposition). A rate controller 18 receives a user defined bit rate and an indication of achieved bit rate as inputs and determines bit allocation on a frame by frame basis. A channel coder 20 exploits coding redundancies between channels and sub-bands. A bit allocator 22 allocates bits according to perceptual importance of the coded sub-bands. A differential coder 24 receives an indication of predicted sub-band samples and uses a residual signal to reduce quantization noise. A quantizer 26 quantizes coded sub-band samples according to their perceptual importance. An inverse quantizer 28 performs inverse quantization which is used for predictive purposes and quantization noise analysis. A predictor 30 predicts sub-band samples by exploiting spatial coding redundancies within each sub-band. A stream coder 32 codes, e.g. using entropy encoding, the quantized sub-band samples into a data stream, preferably using lossless coding to reduce the bit rate.

The decoder 14 includes blocks for performing the inverse of the coding performed by the encoder 12. In FIG. 1, the decoder further includes a stream synchronization decoder 34 for synchronizing to the start of audio frames and decoding frame headers to configure the multi-dimensional algorithm being implemented by the system 10. A stream payload decoder 36 recovers the payload data after synchronization. One or more of the blocks in the encoder and/or decoder may be configured to improve error robustness.

In preferred embodiments, the system 10 and in particular the encoder 12 is configurable to use any selected one (or more) of a respective plurality of configurable coding methods (which may also be referred to as coding tools) in respect of one or more aspects of its operation. For example, a plurality of different coding methods, or variations on coding methods, may be available to the encoder 12 (and/or decoder 14 as applicable) for performing at least one of the tasks of data compression, predictive coding, quantization, subbanding, channel coding, error correction coding, entropy coding and/or any other coding task to be performed. Depending on which method is selected, the performance of the system 10 may differ with respect to performance measures such as latency, bit rate, encoder complexity, decoder complexity, error resilience and quality attributes. Advantageously, it is possible to dynamically modify the choice of coding tools at any given time, but the selected coding tools must be communicated to the decoder.

One option for a user wishing to utilize a multidimensional audio coding algorithm is to determine the optimal configuration of that algorithm given a wide range of configurable coding tools and operating environments. This can be a significant challenge, particularly in a system where complex external factors affect the performance of the audio compression system. Examples of external environmental changes include: a microprocessor in an embedded device running other tasks can experience processor, cache and memory performance variations over time that effect the efficiency of coding tools; the multidimensional audio coding algorithm can operate on different processor architectures, resulting in varying performance of coding tools based on hardware capabilities; a transmission channel can periodically be subjected to noise due to an adverse environment; the system enters a low power state to prolong the battery life.

In order to dynamically configure the system 10, an adaptive controller 40 is provided. The controller 40 receives an input, e.g. set by a user or an external system (not shown), comprising data indicating one or more performance goals. The controller 40 also receives one or more other inputs comprising data value(s) for one or more performance parameters of the system 10, for example parameter(s) of the performance of the encoder 12, the decoder 14 and/or the transmission channel 13. In FIG. 1, the controller 40 receives an input from the encoder 12 comprising one or more parameter values relating to the encoder's performance, e.g. a complexity parameter (which typically provides an indication of how much computer processing power is required by the encoder 12), a latency parameter (which is an indication of the delay introduced into the streamed audio data by the system 10), and/or an audio quality parameter. From the transmission channel 13, the controller 40 receives an input comprising data indicative of available bandwidth and/or other channel statistics. Examples of channel statistics include (a) the packet loss rate, (b) bit error rate (BER), (c) a measure of the BER distribution, (d) minimum/maximum transmission packet size, (e) optimal transmission packet size for maximum throughput and/or latency. From the decoder 14, the controller receives an input comprising data indicative of decoder complexity. If the decoder 14 is of the type that can provide data to the encoder 12 across a bidirectional communications channel it could provide useful performance measures to the controller 40 such as (a) complexity, (b) the percentage of the audio stream that has been discarded due to error, (c) a quantitative measure of the decoded audio quality, (d) metrics describing the types of errors encountered when decoding the audio stream. Typically, the channel statistics include the channel error characteristics described above, allowing general decisions about the data stream to be determined, such as frame sizes, suitable latencies and whether error correction coding is required. The decoder 14 may provide error performance data related to the coded audio stream that allows the encoding system to modify the stream structure to specifically target problems, e.g. the relative number of corrupted frame headers is high so the encoder decides to use error correction coding on the headers.

The adaptive controller 40 is configured to evaluate the received performance measurement data against the received performance goals data in order to determine how the system 10, and in particular the encoder 12, should be configured. If appropriate, the controller 40 communicates configuration data to the system 10, and in particular to the encoder 12, in response to which the encoder 12, and/or any other appropriate component of the system 10, adapts its configuration in accordance with the configuration data. In particular, the controller 40 may cause the encoder 12 (and/or any other appropriate component of the system 10) to adopt one or more of the available coding tools, or coding methods, selected by the controller 40 in respect of one or more aspects of the encoder's, or system's, operation, and/or to adjust the operation of one or more coding methods/coding tools already in use. Hence, the performance of the system 10 changes in accordance with the configuration changes under the control of the controller 40 seeking to meet the performance goals.

Thus, in a dynamically-changing system, the coding tool(s) appropriate for a particular performance goal are selected by the controller 40 in real-time using an adaptive control method in response to system performance data.

Advantageously, the adaptive controller 40 is configured to operate independently of the characteristics of the encoder 12, decoder 14 or transmission channel 13, i.e. the controller 40 is able to interact with the rest of the system 10 as a "black box" in that it receives performance related output signals from the other components of the system 10 provides configuration input(s) to the other components of system 10 but does not need to know what the system comprises, how it is configured, how it works or how configuration changes will affect its operation. This removes the need to support accurate mathematical modeling of the system 10.

Hence, the adaptive controller 40, given no prior knowledge of the system in which it is operating or the capabilities of the audio coding tools available to the audio coding algorithm implemented by the system, is capable of learning which coding tools provide optimal performance in various circumstances (as for example may be determined by the performance goal(s)). To this end, the adaptive controller 40 is advantageously configured to implement a machine-learning algorithm, preferably a machine-learning algorithm that can adapt to an unknown operating environment. The machine-learning algorithm can optionally be initialized with prior knowledge of the system 10 to reduce initialization delay, e.g. provided with one or more sets of configuration data with which the system 10 may be initialised. As a result, the system 10 is able to dynamically adapt to demands such as reducing the audio coding complexity when a device employing the system 10 enters a low power state, or reducing bit rate to meet fluctuating transmission channel demands. Advantageously, the adaptive system 10 can be implemented within any external system, device or processor architecture and does not require tuning to achieve optimal performance. This leads to additional benefits in reduced engineering time when implementing the multidimensional-adaptive audio coding algorithm.

As is described in more detail hereinafter, preferred embodiments of the invention involve the application of machine-learning to an audio coding system such that the performance of the system can be varied in terms of one or more of: the encoder complexity, decoder complexity, algorithmic latency and error resilience, whilst also pursuing the goal of achieving optimal audio quality for a given bit rate. To this end, the controller 40 comprises one or more machine-learning agents, each agent being configured to implement a machine-learning technique. In preferred embodiments, the controller 40 comprises a respective machine-learning agent for each coding tool or method that it is able to control.

In preferred embodiments, the adaptive controller 40 is configured to use a reinforcement learning technique, for example SARSA (State Action Reward State Action) or Q-learning, for selecting and configuring the components of the audio codec 10'. A SARSA, or similar, machine-learning agent operates by taking a given action in a given state. The states are learned during use through determination of a respective optimal solution to a respective action value function. An advantage of a SARSA, or similar, agent is its ability to take actions without knowledge of the system it is controlling.

To implement within the controller 40 a SARSA agent (or other machine-learning agent), the range of states that the controller 40 can take, or select, is divided into a finite set of states, where each state represents a value, or range of values, that one or more respective performance parameters (e.g. complexity, latency, bit rate, quality) of the system 10 can take. In preferred embodiments, each machine-learning agent implemented within the controller 40 is configured to control a respective one configurable aspect of the codec 10's operation, e.g. a respective coding tool or coding method, such as entropy coding, quantization, sub-banding, error resilience or other compression coding tool/method. In respect of each agent, the controller 40 receives from the codec 10' data representing one or more performance parameters that are relevant to the configurable aspect that is under the respective agent's (and ultimately the controller's 40) control. Using the respective agent, the controller 40 is able to select any one or more of a plurality of actions for implementation by the codec 10' which change the configuration of the codec 10' in respect of the aspect under control, e.g. by selecting one type of coding tool/method over another, and/or by adjusting one or more operating parameters of a coding tool/method. For example, the controller 40 may include a respective agent for controlling a respective coding tool (e.g. entropy coding) which can perform a number of actions (e.g. which type of entropy coding to use).

Typically, each performance parameter can take a wide range of values (which may be continuous rather than discrete) and so the overall range is preferably divided into a set of quantized levels, such that each possible value falls into one or other of the quantized levels. Where the performance parameter can take a smaller number of discrete values, each discrete value may correspond to a respective state. The state-space supported by the controller 40 can be quantized into one or a plurality parts, for example where each part corresponds to a respective relevant performance parameter (e.g. it may be desired only to divide the state-space into a small range of encoder complexities, or a larger range of complexities, latencies and packet loss rates). When generating the state-space, as the number of performance parameters used increases, and the granularity of the quantization becomes finer, the size of the state-space increases (requiring significantly more memory) and takes longer for the controller 40 to learn, but once it is initialized it can react faster and more appropriately to changes. Hence, the size of the resulting state-space is determined by the number of input variables (e.g. complexity, latency or other performance parameters) provided by the system 10', and the number of quantized levels provided for each variable.

For each machine-learning agent supported by the controller 40, each state is associated with a plurality of respective actions (e.g. selection of a coding tool, type of coding tool or modification of a coding tool as appropriate to the respective agent) that could be selected by the controller 40 using the respective agent, where each action may result in the state being modified. For each agent, a respective state-action value, which in this example is referred to as a Q value, for each possible state and action is maintained by the controller 40 to allow it to choose between actions. The controller 40 (or more particularly the respective machine-learning agent implemented by the controller 40) maintains a state-action value for each element of the state-space, where each element comprises a respective state in association with a respective one of its actions (the state-space being composed of a plurality of states and a plurality of actions for each state). For example, if the state-space for the controller 40 comprises 3 states of encoder complexity and, in respective of a given machine-learning agent, 4 possible actions, the controller 40 maintains 12 state-action values for the given machine-learning agent. Given the encoder complexity (e.g. by way of initialization or through the learning process), the controller 40 can determine which of the 3 states it is in. It can then evaluate the relevant performance parameters using a reward function to modify the appropriate state-action values for the operating state. Next, the controller 40 determines the next action to take according to which of the 4 state-action values is determined to be optimal. In respective of each machine-learning agent, the goal of the machine-learning algorithm implemented by the controller 40 is to learn which action is optimal for each state by finding which state-action value (Q value) is largest (or smallest depending on how the calculation is performed).

The state-space does not have to include states in respect of all of the relevant performance parameters, but the state-action evaluation typically does assess all relevant performance parameters. Dividing multiple parameters into a quantized state is conceptually the same as creating a multidimensional state, e.g. complexity can be HIGH or LOW, latency can be HIGH or LOW, therefore the quantized state is of size STATE[2][2] and all possible quantized states are covered with 4 elements.

The adaptation of the state-action values (Q values) may be performed using equation (1) shown below. For any given state s and action α, the Q value is updated according to a learning rate α and a discount factor β. Parameter t is an index, typically representing time. The learning rate α determines the rate at which the Q state-action is adapted to the reaction of the system 10 to changes implemented by the controller 40. The discount factor β determines the impact of future state-actions that will be taken. Over time the discount factor typically decays in order to make the learning algorithm less opportunistic and more stable. It will be understood that the invention is not limited to SARSA and in alternative embodiments other state-action values may be maintained using other formulae.

$$Q(s_t,a_t)=Q(s_t,a_t)+\alpha[r_{t+1}+\beta Q(s_{t+1},a_t)-Q(s_t,a_t)] \quad (1)$$

Equation (1) relates to the machine-learning method SARSA (or "SARSA" Q-learning), which is closely related to and derived from O-learning. Other machine-learning methods, e.g. other O-learning methods such as "Watkins" Q-Learning, may alternatively be used.

Hence, in the preferred embodiment, the optimal solution to the action-value function is found using the State-Action-Reward-State-Action (SARSA) algorithm of equation (1). SARSA updates the state action Q value using an error signal that is modified according to the learning rate α.

The reward of the action that has been taken is represented by r(t+1) and is calculated by any suitable reward function. The reward contributes to the modification of the Q state-action values to effect a learning process, whereby the action taken is determined by the state-action with the highest value. The learning rate is determined by the value of α. The discount factor 0<β<1 determines the impact of future state-actions that will be taken. As the discount factor tends toward 1 the learning algorithm becomes more opportunistic. The discount factor may decay over time to promote steady-state operation. The reward function can assess one or a plurality of performance parameters when calculating the reward value, the assessment typically involving comparison of the performance parameter(s) against the relevant performance goal(s), In preferred embodiments, the adaptive controller 40 comprises a plurality of machine-learning agents (e.g. a respective agent for each coding tool/method to be controlled). Each agent is configured to recognize the relevant performance goal(s) and to understand that it can choose to perform one or more of a plurality of actions in order to achieve the goal(s). Each agent monitors the environment that it operates within (as for example is determined from the input(s) received from the encoder 12, transmission channel 13 and/or decoder 14—whose values determine the state of the machine-learning agent) and the effect of actions that it exerts on that environment (as for example is determined from the subsequent input(s) received from the encoder 12, transmission channel 13 and/or decoder 14). Each agent acts as an autonomous entity that continually adapts to the varying environment and goals.

Figure 4:
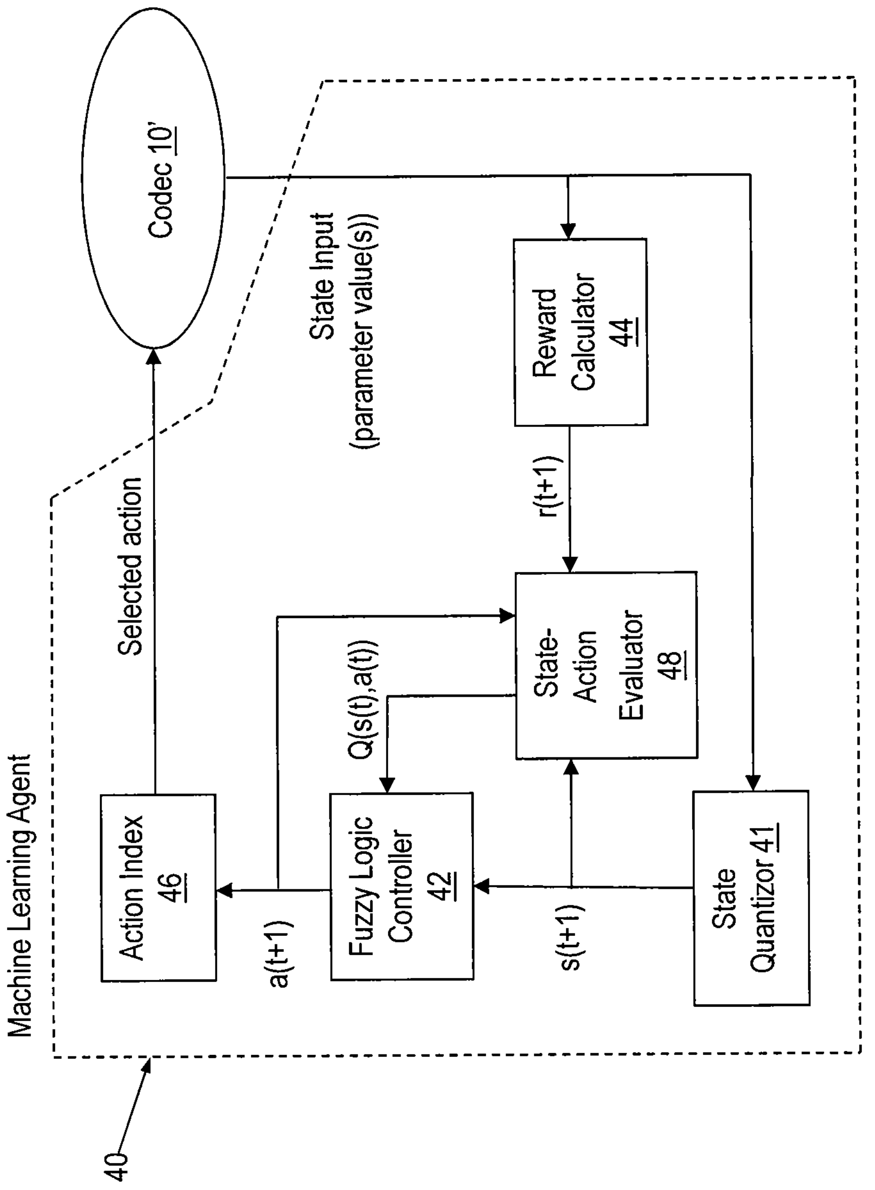
FIG. 4 is a schematic diagram illustrating an adaptive control apparatus embodying one aspect of the invention.

Typically, in respect of each machine-learning agent, the adaptive controller 40 includes a logic controller for selecting actions. By way of example, the logic controller may comprise a fuzzy logic controller 42 (FIG. 4). Fuzzy logic is a multi-valued logic utilized in soft computing to represent variables that contain a range of logic states, thereby allowing concepts to be represented as partially true. Rather than attempting to model the system mathematically, the fuzzy logic controller 42 implements a conditional rule-based approach, for example comprising rules of the form IF X AND Y THEN Z, where X and Y are antecedents each representing a possible system state (e.g. a variable such as a performance measure taking a particular value), and Z is a consequent representing an action to be taken. Such rules rely upon experience rather than technical understanding of a system to determine actions that must be taken.

Each input variable of the fuzzy logic controller is mapped to a set of membership functions known as fuzzy sets. The membership functions may conveniently be represented as triangles or other two dimensional shapes and the fuzzy logic outcome may be controlled through manipulation of the geometry of each triangle or other shape. The parameters that can be manipulated include the height, width, centre position and gradient of each membership function.

The fuzzy logic controller 42 implements an input stage, a processing stage, and an output stage. During the input stage, the fuzzy logic controller 42 maps the or each input(s) to one or more appropriate membership functions. In the processing stage, the controller 42 applies the or each appropriate rule and generates a result for each rule, after which the results are combined using any suitable combination method to produce a combined result. At the output stage, the controller 42 maps the combined result to a consequent membership function that determines the output variable. The controller 42 converts the combined result into a specific "crisp" output value using a process known as defuzzification.

Figure 3:
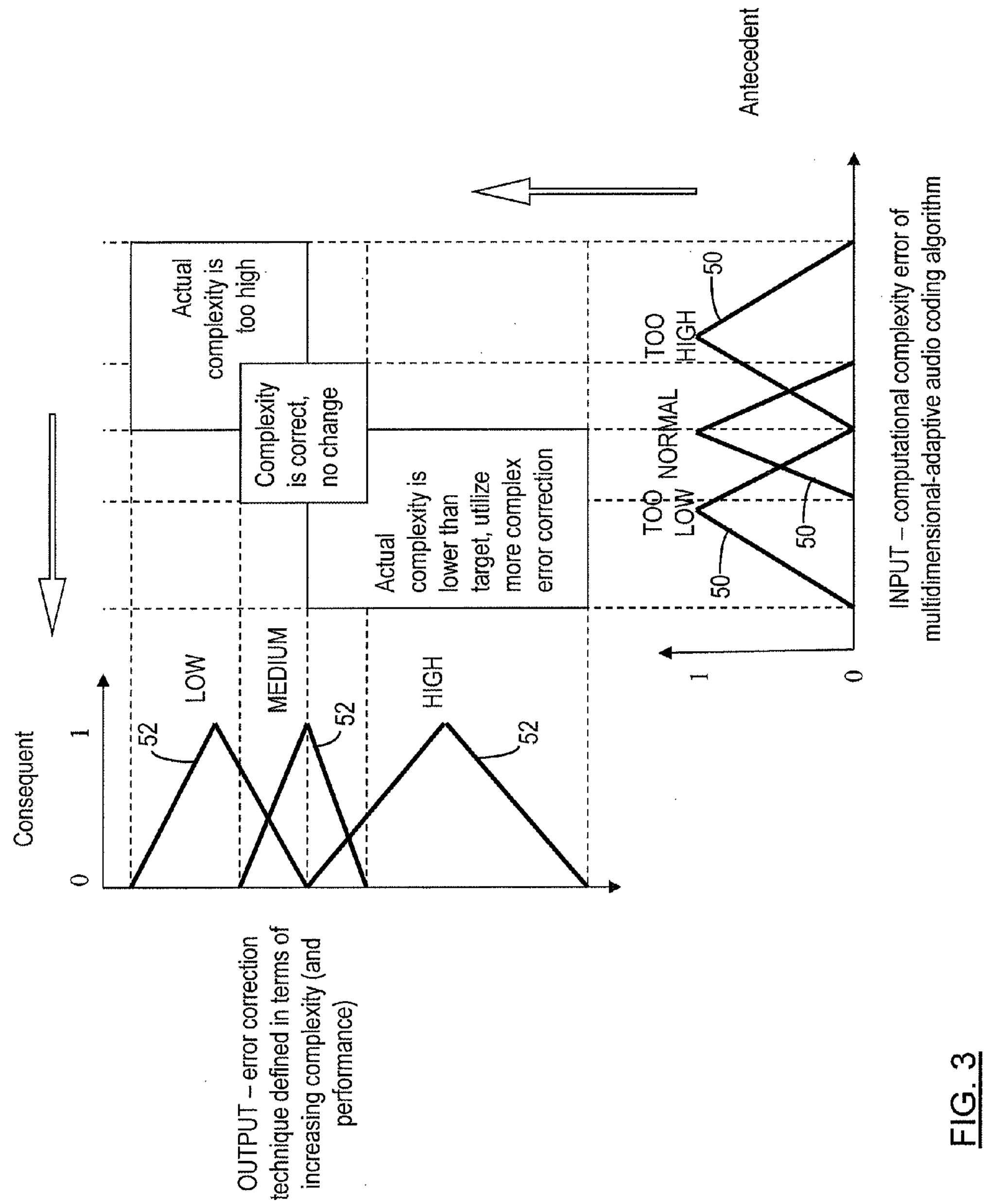
FIG. 3 is a graphical illustration of how a three rule fuzzy logic controller may be used to select the appropriate error correction tool based upon the complexity of a multidimensional adaptive audio coding algorithm.

An example of the operation of a fuzzy logic controller is shown in FIG. 3 where the input variable is the computational complexity error value received from the system 10, and is mapped to a fuzzy set having three membership functions represented by three antecedent triangular membership functions 50. The three functions 50 each describe a performance characteristic, in this case computational complexity, of the audio coding algorithm being implemented by the system 10. In this example the functions describe the complexity as being TOO LOW, NORMAL or TOO HIGH respectively. The fuzzy antecedent outputs for each possible output state are determined from the scaled sum of the membership functions for any given input. The fuzzy consequent membership functions 52 are used to combine the fuzzy antecedent state results into a single result. This process can be performed by a fuzzy centroid algorithm, which can determine the centroid position of the combined area of fuzzy membership functions. Once a single conclusion has been reached the output value must undergo defuzzifcation to obtain a crisp variable. This variable forms the output of the fuzzy logic controller 42 that is used to control the system 10. In this example, the crisp output determines the use of one of three possible error correction coding schemes, each corresponding to a different level of complexity. Hence, FIG. 3 shows how a three rule fuzzy logic controller can be used to select the appropriate error correction tool based upon the complexity of the multidimensional adaptive audio coding algorithm.

FIG. 4 shows a preferred embodiment of the adaptive controller 40 wherein the controller 40 is configured to implement a machine-learning algorithm, SARSA in this example, and includes an action selector 42 which preferably comprises a fuzzy logic controller. In alternative embodiments, a binary logic controller may be used instead of a fuzzy logic controller. When combined, a logic controller, especially a fuzzy logic controller, and a machine-learning algorithm, especially a SARSA algorithm, can be used to provide the machine-learning agent.

In FIG. 4, the controller 40 (and more particularly the machine-learning agent implemented by the controller 40) communicates with the audio codec 10', treating it as an unknown system. The controller 40 receives an input from the codec 10' comprising one or more parameter value for one or more performance parameters (e.g. latency, complexity, bit rate, BER, bit burst error rate etc.) being monitored by the controller 40. The parameter value input may be regarded as a state input, since each parameter value falls within one or other of the quantized levels corresponding to a state supported by the controller 40. FIG. 4 shows the architecture for a single machine-learning agent (shown within the broken line) which, in the preferred embodiment, is configured to control a single configurable aspect (e.g. coding tool) of the codec 10'. In alternative embodiments, the controller 40 may include more than one machine-learning agent, each of which may have the same or similar architecture to that shown in FIG. 4, and each configured to control a respective configurable aspect of the codec 10'.

As described in relation to FIG. 1, the controller 40 also receives one or more performance goals relating to the relevant performance parameter(s). The controller 40 can select one or more of a plurality of actions in response to the parameter value input(s), the or each action corresponding to a change in configuration of the codec 10', e.g. an action may corresponding to the selection of a coding tool or method, or the setting of a parameter relating to a coding tool or method. The controller 40 communicates the selected action(s) to the codec 10', in response to which the codec 10' adjusts its configuration accordingly, e.g. changes one coding tool or type of tool for another, and/or adjusts the operation of an existing coding tool. The controller 40 determines which actions should be taken to achieve the required performance goals as is now described in more detail.

The machine-learning agent implemented by the controller 40 includes a reward calculator 44. The reward calculator 44 determines a value for a reward parameter, or variable, r(t+1), from the performance parameter value(s) received from the codec 10'. The reward value can be calculated in any desired manner, but preferably involves or is based on an evaluation of the performance parameter value(s) against one or more of the performance goals. The reward value calculation preferably also involves evaluation of the performance parameter value(s) and/or the relevant performance goal(s) against one or more parameter values, e.g. the corresponding performance parameter value(s), for the current state of the controller 40. In this way the reward value calculation assesses the controller's 40 reaction. Preferably, therefore, reward calculation utilizes knowledge of the current state of the system to describe the reaction of the controller 40. This reaction is based upon the goals that have been set and an understanding of what are deemed to be system failure conditions. The reward variable r(t+1) may therefore be said to comprise a description of the controller's 40 reaction to the system state.

The agent implemented by the controller 40 includes a state quantizer 41 for determining which state the, or each, parameter value input corresponds with, and produces an output indicating the determined state. For the purposes of the next action selection, the determined state is designated as the "next state", s(t+1), of the controller 40 since it is the state that resulted from the current action selection. Continuous-data performance state parameters received from the codec 10' (e.g. computational complexity, computational latency, BER and bit burst error rate) are quantized, preferably uniformly quantized, to form an index into the finite state space supported by the controller 40. This index is used to form the next state of the controller 40, s(t+1).

The agent implemented by controller 40 includes a state-action evaluator 48 that maintains a respective evaluation parameter (state-action value) for each state-action supported by the controller 40 for the respective agent, where each selectable action for each state constitutes a state-action. In the preferred embodiment, the controller 40 implements a form of Q learning and so the state-action value is the Q value, which may be determined by equation (1). The state-action evaluator 48 updates one or more relevant state-action values depending on the value of the respective reward variable. For a given state, the respective reward value used to update the respective state-action values is calculated using the performance parameter value(s) received from the codec 10' in response to implementing the action(s) previously selected for that state and previously communicated to the codec 10'. In the preferred embodiment, and in accordance with equation (1), the state-action values (Q values) are also updated depending on the corresponding state-action values for the next state s(t+1).

The determined next state s(t+1) is communicated to the logic controller 32 in order that the logic controller 32 knows what the previous state s(t) will be for its next evaluation.

The state-action evaluator 48 communicates the, or each, relevant state-action value (Q value) to the logic controller 42, which serves as an action selector. The logic controller 42 evaluates the received state-action values and selects one using any suitable selection criterion/criteria. The action corresponding to the selected state-action value is the action selected by the controller 40 and communicated to the codec 10'. In the preferred embodiment, it is the last (i.e. previous) state s(t) of the controller 40 and the corresponding state-action values Q(s(t), a(t)) that are used to determine the appropriate action a(t+1) to take. Conveniently, the agent implemented by the controller 40 includes an action index 48, the logic controller 42 selecting an action value a(t+1) that identifies a corresponding action from the index 48. The action index 48 may then communicate the identified action to the codec 10'.

In alternative embodiments, the logic controller 42 may be configured to select a state-action (and therefore to select the next action) from a plurality of received corresponding state-action values by applying any desired evaluation method to the state-action values, e.g. simply picking the highest state-action value (or lowest depending on how the state-action values are calculated).

In the preferred embodiment, however, where the logic controller comprises a fuzzy logic controller, the state-action values received by the logic controller 42 are used to construct consequent fuzzy membership functions. The state-action values (which are periodically updated using the reward function) are used to define the ranges of the consequent membership functions, e.g. the centre position, width, height and gradient of the consequent triangles in FIG. 3. The antecedent membership functions for the fuzzy logic controller 42 may be found empirically by experimentation (the values are not important as the controller 40 will adapt). This allows the controller 40 to reward a beneficial outcome such that the associated action is more likely to occur in the future. If the system 10' behaves differently in future then the fuzzy consequent logic will adapt and a more appropriate action will be determined after an initial learning period.

Where the controller 40 implements more than one machine-learning agent, it may be arranged to use some or all of the respective agents in a sequential fashion, with the agents that make critical decisions being applied after those that perform less critical decisions. For example, the agent that monitors the error resilience of the codec 10' is typically implemented last. However, some machine-learning agents may be run in parallel with others, as is described in more detail hereinafter with reference to FIG. 7.

Figure 5:
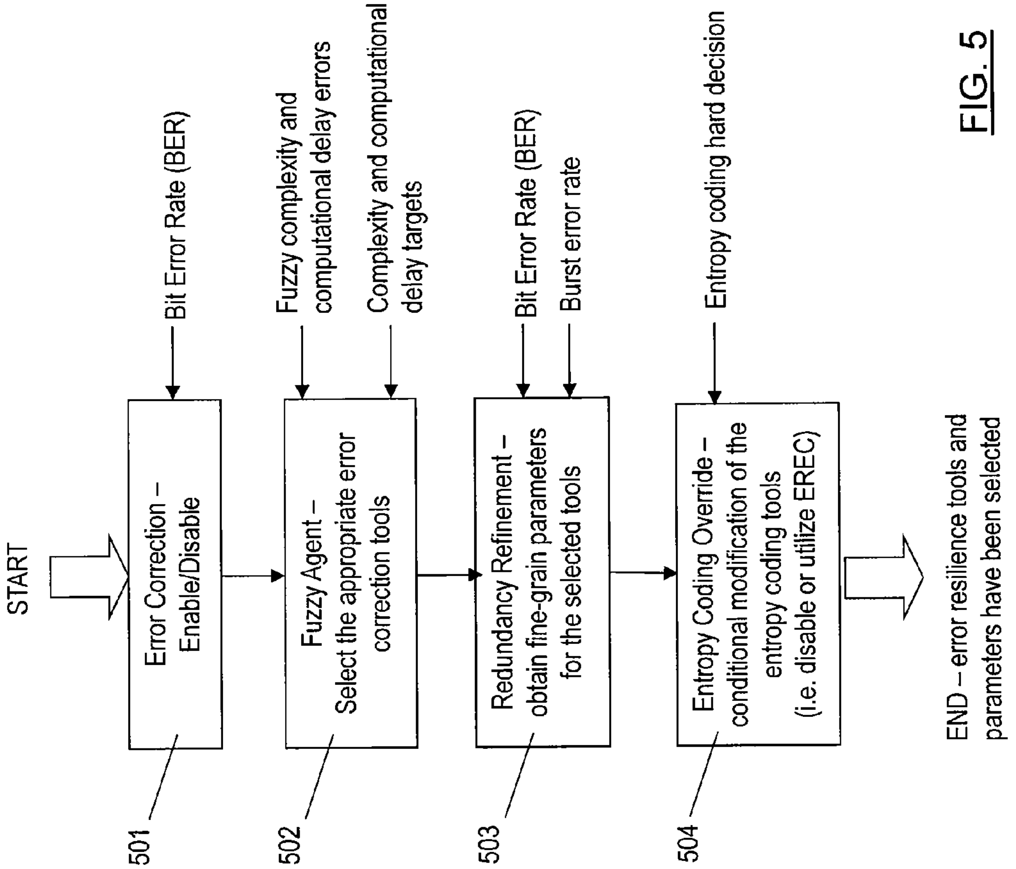
FIG. 5 is a flow chart illustrating a control process for use in achieving error resilience in a multi-dimensional adaptive audio coding algorithm.

FIG. 5 illustrates a control process for use in controlling error resilience in the codec 10'. In this example, an error resilience machine-learning agent implemented by the controller 40 is provided with input performance parameter values for the complexity error, computational latency error, bit error rate (BER) and maximum length of bit burst errors. The agent preferably also has access to decisions taken by preceding machine-learning agent in respect of actions that will impact on the performance of error resilience. For example, decisions to utilize Golomb-Rice VLC codes can have a detrimental effect on error resilience and audio quality if the transmission channel suffers from noise. At block 501, the agent determines whether to enable or disable error correction by evaluating the received bit error rate value. At block 502, the agent selects the appropriate error resilience tools and/or configuration of error resilience tools using the machine-learning technique described above based on the received complexity and computational latency error values and respective targets. At block 503, the agent determines one or more settings for the selected coding tool(s) using the received bit error rate and burst error rate. At block 504, the agent may select to override a previous decision made by a previously applied agent (as indicated by the entropy coding hard decision input in FIG. 5).

Figure 6:
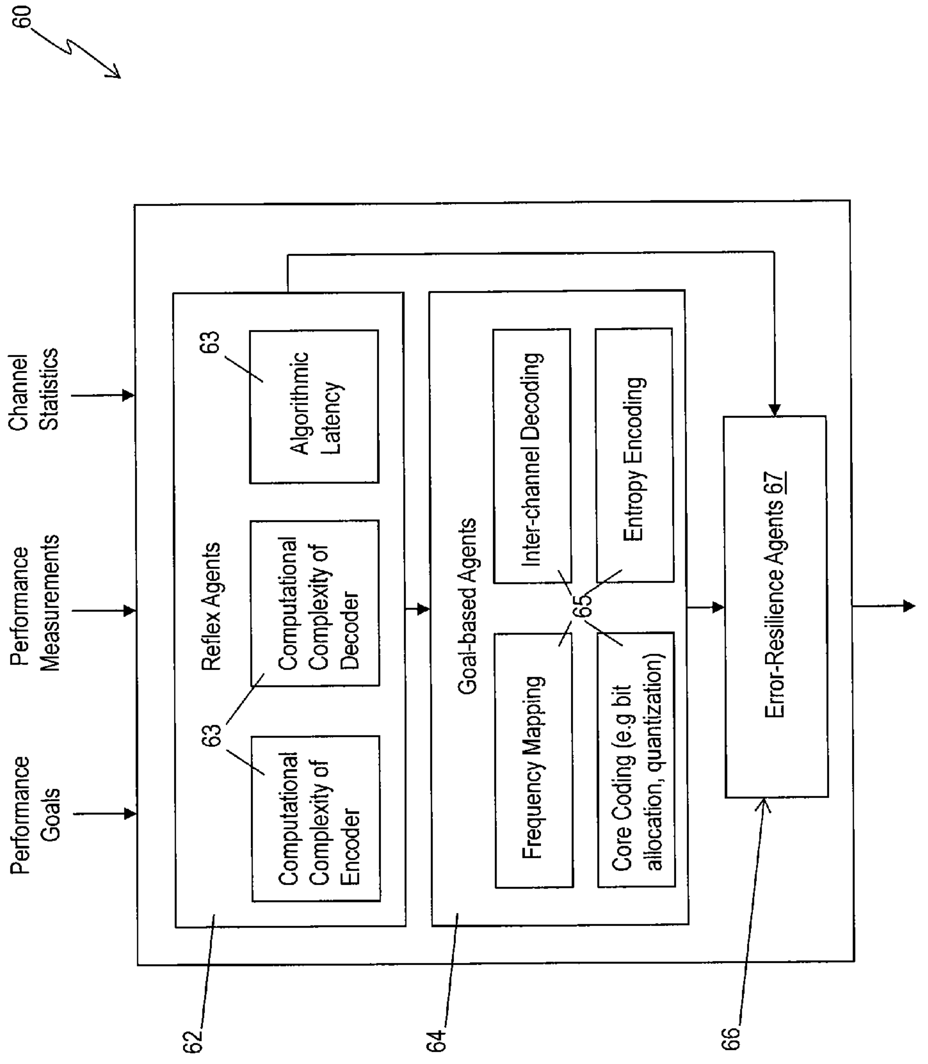
FIG. 6 is a conceptual diagram illustrating a hierarchy of agents used in the preferred adaptive control apparatus.

Referring now to FIG. 6, there is shown a system 60 of learning agents that may be implemented by the adaptive controller 40 for controlling a multidimensional audio coding apparatus or method. The system of learning agents responsible for controlling the multidimensional audio coding algorithm is advantageously hierarchical in structure. The system comprises a first level 62, a second level 64 and a third level 66, a respective one or more agents being assigned to each level 62, 64, 66. In a preferred mode of use, a respective one or more agents from each level are applied sequentially according to the level hierarchy, whereby the respective one or more agents from the first level 62 are applied first, the respective one or more agents from the second level 64 are applied after the first level agents have been applied, and the respective one or more agents from the third level 66 are applied after the agents of the second level have been applied. The respective agents are advantageously applied at an appropriate rate such that previous coding tool selections are able to have an effect before they are rewarded.

The first level 62 comprises at least one but typically a plurality of preliminary performance assessment agents 63, referred to herein as reflex agents. In the preferred embodiment, a respective reflex agent is provided for each performance measure, e.g. encoder complexity, decoder complexity, algorithmic latency, bit rate and/or error resilience, being assess by the controller 40. Each reflex agent 63 receives from the codec 10' relevant data indicating the actual performance of relevant aspects of the codec 10' (e.g. performance measurements such as encoder complexity, decoder complexity, algorithmic latency, bit rate and/or error resilience, and/or channel statistics such as packet loss rate and bit error rate) and is configured to assess the received data against corresponding received performance goal data, and to produce or more corresponding output signal comprising data indicative of the error between the actual measured data and the respective performance goal(s). Typically, a respective error output signal is produced for each performance measure being controlled, i.e. a respective error output signal for each reflex agent 63 in the preferred embodiment.

Accordingly, in producing the error output signals, the reflex agents 63 are responsible for determining the level of adjustment that should be made by the controller 40 in terms of the performance goals and the respective actual performance. Preferably, the reflex agents 63 are configured such that short-term deviations from long-term average performance do not unduly influence the subsequent machine-learning agents in the second level 64. To this end the reflex agents 63 may be configured to implement an averaging and/or filtering function to smooth the error signal. In preferred embodiments, each reflex agent 63 comprises an adaptive fuzzy logic controller to obtain an error signal for the respective performance goal(s). In the preferred embodiment, the reflex agents 63 are not machine-learning agents and do not exhibit the architecture shown in FIG. 4. The reflex agents 63 perform some functionality that may otherwise be performed by the reward calculator 44, namely the assessment of measured data against performance goals. More generally, the reflex agents 63 be configured to implement any suitable logic or algorithms for performing their assessment and may be implemented in any convenient manner, e.g. by computer program(s), hardware or a mixture thereof.

The second level 64 comprises at least one but typically a plurality of action selecting agents 65, referred to herein as goal-based agents. In the preferred embodiment, a respective goal-based agent is provided for at least some and preferably all of the configurable coding methods/coding tools under the control of controller 40. Each goal-based agent 65 receives one or more respective error signal from the respective reflex agent(s) 63. Each goal-based agent 65 selects a configuration of the respective coding method/coding tool based on the received error signal(s). Hence, the goal-based agents are responsible at least for an initial selection/configuration of coding tools. Advantageously, the goal-based agents 65 comprise machine-learning agents of the type described above with reference to FIGS. 1 and 4 in particular, and may for example exhibit the machine-learning agent architecture shown in FIG. 4.

In use, the controller 40 implements a series of exploration episodes in which, for each episode, a respective one or more of the goal-based agents 65 are run to determine its optimal state-action. Preferably, the goal-based agents 65 are initially provided with a high discount factor β to encourage opportunism and adaptation. Over time the discount factor is preferably decreased to ensure that a state-action will be selected and oscillation does not occur. If a state-action is determined to produce a failure, the controller 40 re-initializes the discount factor to ensure that an appropriate tool is selected by means of opportunistic learning.

The third level 66 comprises at least one but typically a plurality of error resilience agents 67. In the preferred embodiment, a respective error resilience agent is provided for at least some and preferably all of the configurable coding methods/coding tools under the control of controller 40 that relate to error resilience. Each error resilience agent 67 receives from the goal-based agents 65 data indicating any selected coding tools or configurations that may affect error resilience. The error resilience agents 67 also receive relevant error signal data from the reflex agents 63, e.g. complexity error, computational latency error, bit error rate (BER) and maximum length of bit burst errors. Alternatively, the error resilience agents 67 may obtain the relevant performance goal data and performance measurement data (including channel statistics) from the codec 10' and calculate the relevant error data themselves. Based on the respective error signals, the error-resilience agents 67 select the relevant error correction coding tool and/or configuration of error correction coding tool and in so doing may override, if appropriate, any conflicting selection made by one or more of the goal-based agents 65.

Hence, once the optimal selection of coding tools has been made by the goal-based agents 65 in the second level of the hierarchy, the error resilience agents 67 are used to ensure that error robustness is maintained. For example, the error resilience agents 67 may be used to apply the appropriate level of error detection and error correction given the bit error rate or packet loss rate, and/or may disable all forms of entropy coding if error rates are sufficiently high. Advantageously, the error resilience agents 67 comprise machine-learning agents of the type described above with reference to FIGS. 1 and 4 in particular, and may for example exhibit the machine-learning agent architecture shown in FIG. 4. The error resilience agents 67 may be configured to operate in the manner described with reference to FIG. 5.

The system 60 of agents 63, 65, 67 can be initialized with no prior knowledge of the codec 10', in which case the machine-learning agents 65, 67 require more time to adapt to previously unknown operating points within the state-space. Alternatively, the system 60 can be initialized with a known good initial state for the machine-learning agents to reduce initialization delay.

In the preferred embodiment, upon initialization of the controller 40: the exploration episode is set to zero; the timeout and learning rate for all machine learning agents are set to known good values that have been determined offline; and each machine learning agent is configured such that opportunistic learning is favoured.

In preferred embodiments, machine-learning agents, especially in the second level 64 of system 60, are implemented for controlling any one or more of the following families of coding tools/methods: sub-band filter architecture; frequency mapping; number of sub-bands; bit allocation; quantization; intra-channel decorrelation; inter-channel decorrelation; lossless entropy coding.

In some applications, the controller 40 may be required to control only a limited range of coding tools so that a more efficient implementation can be achieved. Under such circumstances, it is advantageous that the adaptive controller 40 can easily and flexibly adapt to the requirements of a reduced capability variant of the multidimensional audio coding algorithm. For these reasons the preferred controller 40 allows the available range of actions (i.e. coding tool selection/configuration) to be selected by the machine-learning agents and the choice of error resilience coding tools to be selected depending upon their existence within the audio coding system.

Figure 7:
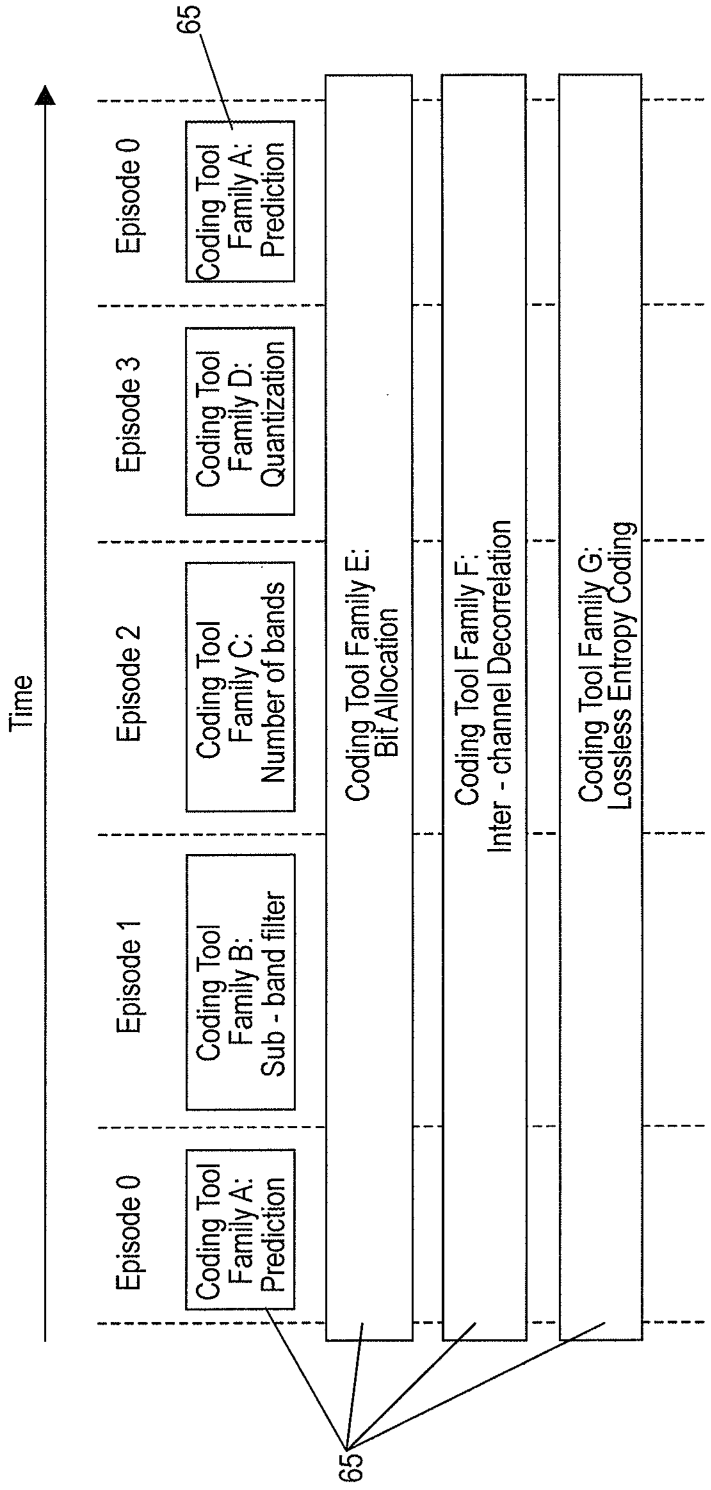
FIG. 7 is a conceptual diagram illustrating how the agents of FIG. 6 may be applied in episodes.

FIG. 7 illustrates how machine-learning agents, and in particular the goal-based agents 65 of the second level 64 in system 60, may be activate episodically, preferably for dynamically variable time intervals. In the illustrated example, four episodes 0 to 3 are assumed, although there may be any number of episodes, e.g. the number of episodes may correspond with the number of the machine-learning agents that need to be run in series.

Some of the machine-learning agents are activated during a single respective episode. In the example of FIG. 7, respective goal-based agents 65 for configuring, respectively, a prediction coding tool, a sub-band filter coding tool, a number of bands coding tool and a quantization coding tool, are activated in episodes 0 to 3 respectively. Typically, agents whose selections have a significant contributing effect to the performance of other agents are implemented in this manner. The sequence in which such single episode agents are activated may also be determined by any effect that the operation of one may have on another. Other machine-learning agents may be continuously activated throughout all of the episodes, especially where their effect is directly attributed to the dynamically changing audio content. In the example of FIG. 7, respective goal-based agents 65 for configuring, respectively, a bit allocation coding tool, an inter-channel decorrelation coding tool and a lossless entropy coding tool, are run across all of the episodes. Typically, the episodes are repeated in a continuos cycle. Before progressing from one episode to the next, the controller 40 may be arranged to determine whether to extend the length of the current episode (e.g. if it determines that the agent activated during the current episode has not had time to select its optimal action), or to terminate the episode (e.g. if it determines that the agent activated during the current episode has selected its optimal action) and move on to the next episode. Hence, the duration of episodes is dynamic and may be determined in real time.

Alternatively, between cycles, the controller 40 may adjust the duration of one or more of the episodes. For example, the controller 40 may elect to increase the length of an episode if it determines that the action selected by the agent activated during the previous instance of the episode did not result in a satisfactory change in the performance of the codec 10 (as may be determined for example from subsequent error signals generated by the reflex agents 63), and/or if it determines that the agent activated during the previous instance of the episode did not have time to select its optimal action. The controller 40 may elect to decrease the length of an episode it determines that the agent activated during the previous instance of the episode selected its optimal action relatively quickly compared to the length of the episode. The controller 40 may elect to discontinue the episode from some or all of the subsequent cycles if for example the coding tool controlled by the respective agent no longer is to be adjusted (e.g. in order to simplify the operation of the controller 40).

In the preferred embodiment, the hierarchical system 60 may be implemented by periodically applying the following iterative process at any suitable variable or fixed rate:

1. Obtain user performance goals and observed performance measurements for the audio codec's performance (e.g. in respect of algorithmic latency, encoder complexity and/or decoder complexity) in the unknown system environment in which it operates.
2. Determine if the performance goals have been modified from a previous instance. If so, reinitialize the exploration episode and modify the discount factor $\beta$ such that opportunistic learning is favored.
3. Calculate a relative error for each of the performance goals. In the preferred embodiment, this is performed by the reflex agents 63, which advantageously provide a damping effect for the measured system performance to ensure that short-term erroneous measurements do not unduly affect the learning system.
4. In respect of the current exploration episode, implement each of the goal-based learning agents associated with that episode. In the preferred embodiment this includes:
   a. Rewarding the previously selected action depending upon the relevant user performance goals, the measured performance and, optionally, on the priority of each of those goals. The user goals may be used alongside a selection of other performance targets of the audio coding system and transmission network. These other targets may include bit rate and signal-to-noise ratio.
   b. Update the learning agent state action values.
   c. Determine the next action to be taken.
   d. Preferably modify the opportunistic behaviour (discount factor $\beta$) of the learning agent based upon the success in achieving goals.
5. Determine if the current exploration episode should be terminated or extended at the next iteration.
6. The channel error characteristics are analyzed, preferably having been normalized. The preferred system utilizes the bit error rate and a measure of the average number of consecutive bit errors.
7. If the (normalized) bit error lies below a predefined threshold the error resilience agents are enabled. Then:
   a. An error resilience agent 67 is used to determine the importance of algorithmic latency and complexity and provide a measure of available "effort" when selecting error resilience coding tools.
   b. The multidimensional audio codec's stream syntax is segmented into header and data fields which are evaluated separately to determine if error correction coding should be applied. The "effort" is evaluated alongside the transmission channel's error statistics. Unequal error protection is applied such that more aggressive error resilience techniques are applied to the header than the data payload.
      i. If the "effort" and the bit error rate lie above an upper threshold then Reed-Solomon coding is enabled (if available).
      ii. If the "effort" and the bit error rate lie above a mid threshold then interleaved Golay coding is enabled (if available).
      iii. If the "effort" and the bit error rate lie above a lower threshold then Golay coding is enabled (if available).
      iv. Otherwise, no error correction coding is applied.
   c. Error resilient entropy coding is enabled (if available), ignoring the decision made by the goal-based learning agents.

In the preferred embodiment, all steps 1 to 7 are repeated each time the process described in steps 1 to 7 is called. The number of times this iterative process is called each second (or other time period) is selected to give an optimal balance of maximum control and minimal computation. Steps 4 and 5 are typically performed for each agent that is active within each episode, where each exploration episode is preferably of an initial fixed duration of time. If it is deemed that any active agent has not selected an optimal action at the conclusion of an exploration episode then the length of that episode is increased, thereby providing the machine learning system with more opportunity to react. Preferably, each exploration episode cannot exceed a maximum duration of time before it is forced to end.

By way of example, the following flow process may be utilized when determining the state-action reward for the machine learning agent responsible for the prediction coding tools:

1. Define a range of maximum permitted performance measurements:
   a. The maximum permitted latency $L_{max}$ is, say, 125% of the target algorithmic latency, whilst the minimum is 0.
   b. The maximum permitted encoder complexity $C_{max}$ is, say, 125% of the target encoder complexity, whilst the minimum is 0.
2. The reward function is configured such that the maximum and minimum possible rewards ($R_{max}$ and $R_{min}$ respectively) are proportional to the expected signal-to-noise ratio (in log decibels) measured by the system.
3. Determine if the state-action has failed with regard to the maximum permitted performance levels, if so:
   a. Reset the discount factor to 1.0
   b. Inform the learning system such that the duration of the current episode window can be increased.
   c. Update the relevant state-action with the minimum possible reward value.
4. Calculate the reward associated with the achieved performance:
   a. The latency reward is directly proportional to the distance from the maximum permitted latency:

$$R_{latency} = \begin{cases} R_{max}\left(1 - \dfrac{L}{L_{max}}\right) & \text{if } L \le L_{max} \\ R_{min} & \text{if } L > L_{max} \end{cases}$$

b. The complexity reward is directly proportional to the distance between the measured complexity and the target complexity:

$$R_{complexity} = \begin{cases} \dfrac{-CR_{max}}{C_{max} - C_T} & \text{if } C \ge C_T \\ \dfrac{CR_{max}}{C_T} & \text{if } C < C_T \\ R_{min} & \text{if } C > C_{max} \end{cases}$$

c. The total reward is equivalent to the sum of $R_{latency}$, $R_{complexity}$ and the log decibel of the signal-to-noise ratio. The reward value is clipped such that a maximum and minimum permitted value is enforced.
5. Update the relevant state-action with the computed reward.

In the context of error resilience, preferred systems 10 embodying the invention have the ability to cognitively adapt to the presence of bit and packet errors. Advantageously, error control tools can be adapted in a dynamic manner, according to external measures of channel noise and other system parameters.

It will be seen from the foregoing that reinforcement learning techniques are used to create an intelligent control system. The resulting machine-learning agent(s) serve as an adaptive controller for a multidimensional-adaptive audio coding system. With no knowledge of the external system into which it is placed the audio coding system is capable of adapting its structure to achieve a high level of error resilience, whilst maintaining other performance goals such as computational complexity.

Controllers embodying the invention, including any agent(s) implemented by the controller, may be implemented in hardware, by computer program(s), or by any combination of hardware and computer program(s), as is convenient.

The invention is not limited to the embodiments described herein, which may be modified or varied without departing from the scope of the invention.

The invention claimed is:

1. A controller for a configurable audio coding system, said audio coding system comprising at least one selectable and/or configurable coding tool, the controller being arranged to receive from said audio coding system an input comprising at least one performance parameter value indicating at least one performance characteristic of the audio coding system, said controller being configured to evaluate a respective one or more of said at least one performance parameter values against a respective one or more performance goals to produce error data in respect of said at least one performance characteristic, said controller comprising a respective coding tool agent for at least some of said selectable and/or configurable coding tools, said respective coding tool agent being arranged to select one or more of, and/or select a configuration of, one or more of said at least one selectable and/or configurable coding tools depending on respective error data.

2. A controller as claimed in claim 1, further including at least one error management agent being configured to evaluate a respective one or more of said at least one performance parameter values against a respective one or more performance goals to produce said error data in respect of said at least one performance characteristic, and wherein at least some of said error data is provided to the or each coding tool agent.

3. A controller as claimed in claim 2, wherein said at least one error management agent comprises a respective error management agent for said at least one performance characteristic.

4. A controller as claimed in claim 2, wherein said at least one error management agent is arranged to, during said evaluation, dampen fluctuations in said error data caused by relatively short term deviations of said at least one performance parameter values against one or more respective performance goals.

5. A controller as claimed in claim 4, wherein said at least one error management agent comprises a fuzzy logic controller.

6. A controller as claimed in claim 1, wherein at least one of said at least one selectable and/or configurable coding tool comprises an error resilience coding tool, said controller further including at least one error resilience agent arranged to select one or more of and/or select and configuration of said at least one error resilience coding tools depending on at least some of said error data.

7. A controller as claimed in claim 6, wherein said at least one coding tool agent is arranged to provide to said at least one error resilience agent data indicating the or each selection made by said at least one coding tool agent.

8. A controller as claimed in claim 7, wherein said at least one error resilience agent is arranged to selectively override one or more of said selections made by said at least one coding tool agent depending on an evaluation made by said at least one error resilience agent of at least some of said error data.

9. A controller as claimed in claim 6, wherein said at least one error resilience agent is arranged to evaluate data, preferably including error data, relating to one or more of bit error rate, packet loss rate, an average bit error rate of said audio coding system and/or any other statistic relating to the performance of the transmission channel of said audio coding system, wherein said average bit error rate comprises a measure of the average number of consecutive bit errors.

10. A controller as claimed in claim 6, wherein said at least one error resilience agent is arranged to selectively enable or disable entropy encoding based on an evaluation of at least some of said error data.

11. A controller as claimed in claim 6, wherein said at least one error resilience agent is arranged to selectively enable or disable entropy encoding depending on the bit error rate of said audio coding system.

12. A controller as claimed in claim 6, wherein said at least one error resilience agent is arranged to select one or more of and/or select and configuration of said at least one error resilience coding tools depending on the algorithmic latency and/or complexity of said audio coding system.

13. A controller as claimed in claim 1, wherein said at least one coding tool agents comprises a plurality of coding tool agents, said controller being arranged to activate one or more of said coding tool agents in a respective one or more of a sequence of episodes.

14. A controller as claimed in claim 13, wherein at least one of said coding tool agents is activated during only one of said episodes.

15. A controller as claimed in claim 14, wherein said at least one of said coding tool agents relates to any one or more of: prediction of sub-band samples; sub-band filter selection or configuration; sub-band analysis; sub-band selection and configuration; and/or quantization.

16. A controller as claimed in claim 15, wherein at least one of said coding tool agents is activated during all of said episodes.

17. A controller as claimed in claim 16, wherein said at least one of said coding tool agents relates to any one or more of: bit allocation; inter-channel decorrelation; intra-channel decorrelation; and/or lossless entropy encoding.

18. A controller as claimed in claim 13, wherein said controller is arranged to terminate any one of said episodes an begin the next of said episodes upon determining that at least one of the coding tools activatable during said any one episode has completed its selection process.

19. A controller as claimed in claim 13, wherein said controller is arranged to run said sequence of episodes in a continuous cycle.

20. A controller as claimed in claim 1, wherein said at least one coding tool agent and/or said at least one resilience tool agent comprises a respective machine learning agent.

21. A controller as claimed in claim 20, wherein said controller is configured to maintain a plurality of states, each state corresponding to at least one of said respective performance parameter values and, in respect of the, or each, machine learning agent, being associated with at least one respective action for configuring said audio coding system, and wherein the or each machine learning agent comprises a reward calculator configured to calculate a reward parameter based on said at least one parameter value and at least one corresponding performance goal, a state-action evaluator configured to maintain a respective state-action evaluation value for said at least one respective action associated with each of said states, and to adjust said respective state-action evaluation value depending on a respective value of said reward parameter, an action selector configured to select, for a respective state, at least one of said at least one respective actions associated with said respective state based on an evaluation of the respective state-action evaluation values of said at least one respective actions associated with the respective state, and wherein said controller is configured to produce an output comprising data identifying said selected at least one action.

22. A controller as claimed in claim 21, wherein the or each machine learning agent further includes a state quantizer configured to determine, from said at least one performance parameter value, a next one of said states to be taken by said machine learning agent.

23. A controller as claimed in claim 1, wherein said at least one performance parameter can take a range of values, the or each machine learning agent further including a state quantizer arranged to define a plurality of bands for said values, each band corresponding to a respective one of said states, and wherein said state quantizer is further arranged to determine to which of said bands said at least one performance parameter of said input belongs to.

24. A controller as claimed in claim 23, wherein said state quantizer is configured to determine that the respective state corresponding to said determined band is a next state to be taken by the respective machine learning agent.

25. A controller as claimed in claim 21, wherein said state-action evaluator is configured adjust the respective state-action evaluation values for a respective state depending on a value of said reward parameter calculated using the at least one performance parameter value received in response to configuration of said audio coding system by said selected at least one action for said respective state.

26. A controller as claimed in claim 21, wherein said state-action evaluator is configured adjust the respective state-action evaluation values for a respective state depending on the corresponding state-action evaluation values for a next state to be taken by said controller.

27. A controller as claimed in claim 21, wherein the or each machine learning agents is configured to implement a machine-learning algorithm for maintaining said state-action evaluation values.

28. A controller as claimed in claim 27, wherein said machine-learning algorithm comprises a reinforcement machine-learning algorithm.

29. A controller as claimed in claim 28, wherein said reinforcement machine-learning algorithm comprises a SARSA algorithm.

30. A controller as claimed in claim 1, wherein said at least one performance characteristic includes any one or more of computational complexity, computational latency, bit rate error, bit burst error rate or audio quality.

31. A controller as claimed in claim 21, wherein said at least one respective action includes selection of at least one coding method or type of coding method for use by said audio coding system.

32. A controller as claimed in claim 21, wherein said at least one action includes selection of a configuration of at least one coding method for use by said audio coding system.

33. A controller as claimed in claim 21, wherein said action selector comprises a fuzzy logic controller.

34. A controller as claimed in claim 33, wherein said fuzzy logic controller uses said respective state-action evaluation values of said at least one respective actions associated with the respective state to construct consequent fuzzy membership functions.

35. A controller as claimed in claim 1, wherein said at least one of said respective performance parameter values and said at least one action are associated with a respective configurable aspect of the audio coding system.

36. A controller as claimed in claim 35, wherein said configurable aspect comprises a configurable coding tool or coding method.

37. A method of controlling a configurable audio coding system, said audio coding system comprising at least one selectable and/or configurable coding tool, the method comprising:

receiving from said audio coding system an input comprising at least one performance parameter value indicating at least one performance characteristic of the audio coding system;

evaluating a respective one or more of said at least one performance parameter values against a respective one or more performance goals to produce error data in respect of said at least one performance characteristic; and selecting one or more of, and/or selecting a configuration of, one or more of said at least one selectable and/or configurable coding tools depending on respective error data.

* * * * *